United States Patent [19]

Maly

[11] Patent Number: 5,324,992
[45] Date of Patent: Jun. 28, 1994

[54] SELF-TIMING INTEGRATED CIRCUITS HAVING LOW CLOCK SIGNAL DURING INACTIVE PERIODS

[75] Inventor: Wojciech Maly, Pittsburgh, Pa.

[73] Assignee: Carnegie Mellon University, Pittsburg, Pa.

[21] Appl. No.: 908,315

[22] Filed: Jul. 1, 1992

[51] Int. Cl.[5] .................. H03K 3/017; H02H 3/16
[52] U.S. Cl. .................. 307/265; 307/296.3; 307/350; 365/227; 361/93
[58] Field of Search .......... 307/296.3, 265, 268, 307/350, 362; 365/227; 361/93, 88

[56] References Cited

U.S. PATENT DOCUMENTS

| | | | |
|---|---|---|---|
| 4,387,449 | 6/1983 | Masuda | 365/227 |
| 4,697,097 | 9/1987 | Rusznyak | 307/296.3 |
| 4,716,463 | 12/1987 | Stacy et al. | 365/227 |
| 4,851,987 | 7/1989 | Day | 365/227 |
| 4,999,516 | 3/1991 | Suter et al. | 307/296.3 |
| 5,025,344 | 6/1991 | Maly et al. | 361/88 |
| 5,128,558 | 7/1992 | Ovens et al. | 307/296.3 |

Primary Examiner—Timothy P. Callahan
Assistant Examiner—Toan Tran
Attorney, Agent, or Firm—Townsend and Townsend Khourie and Crew

[57] ABSTRACT

An integrated circuit function unit operating in a data dependent manner in logic operations of variable lengths of time is provided with a clock signal having a pulse width determined by the active period of the function unit. In one embodiment a current sensor monitors power supply current to the integrated circuit, and when the current exceeds a threshold level the integrated circuit is in an active period. Clock means for generating a clock signal for the function unit responds to the sensed current in controlling the clock period.

11 Claims, 2 Drawing Sheets

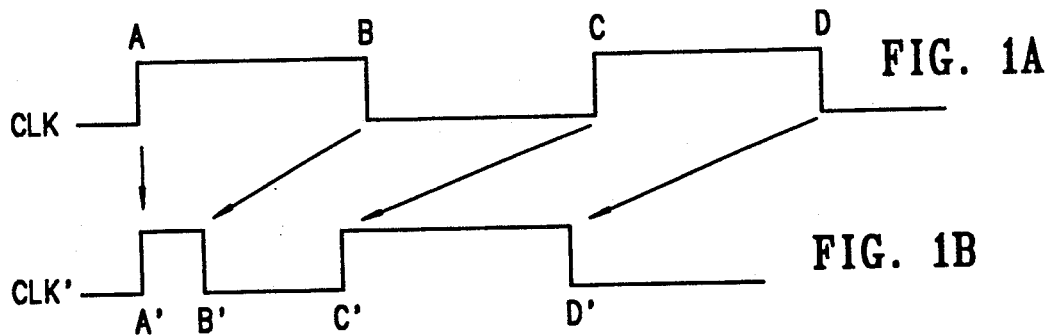
FIG. 1A
FIG. 1B
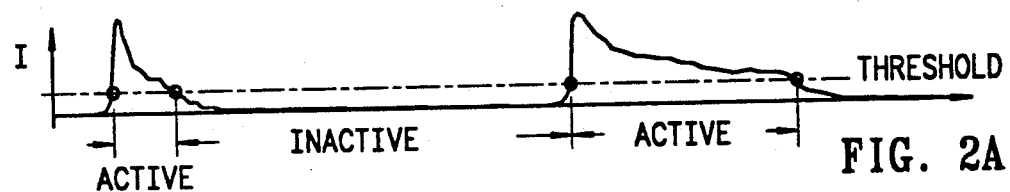
FIG. 2A
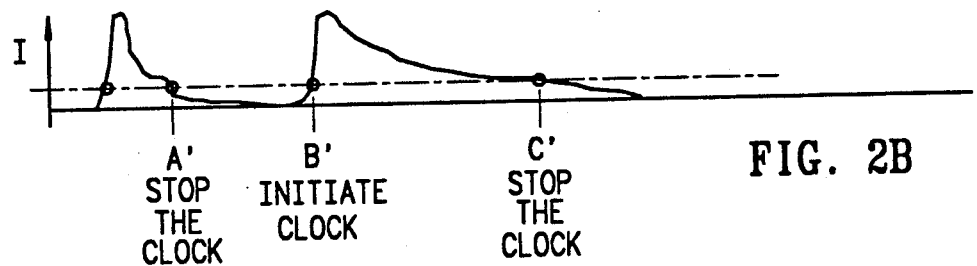
FIG. 2B
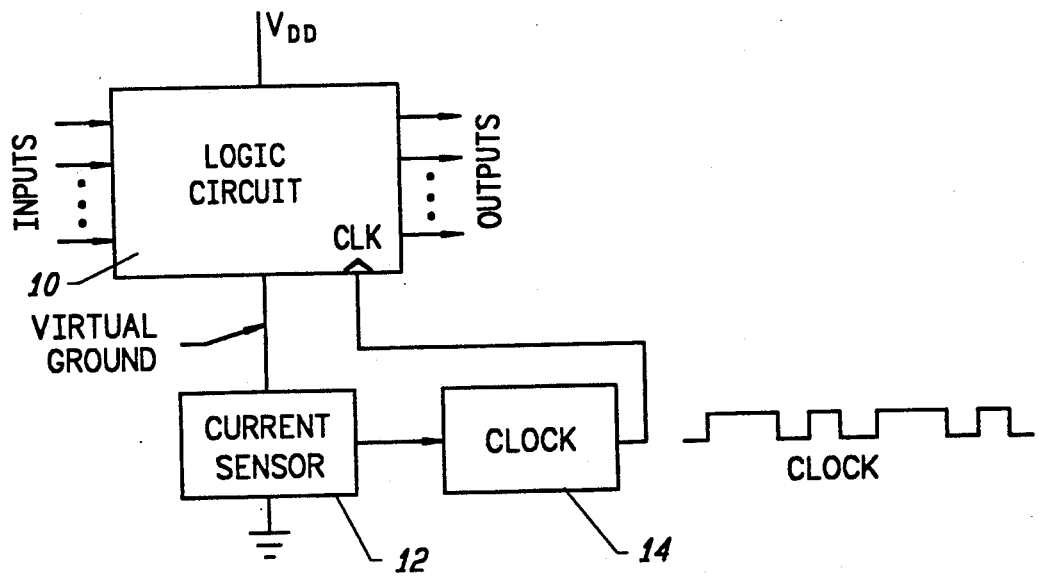
FIG. 3

SELF-TIMING INTEGRATED CIRCUITS HAVING LOW CLOCK SIGNAL DURING INACTIVE PERIODS

BACKGROUND OF THE INVENTION

This invention relates generally to electronic circuits, and more particularly the invention relates to self-timing clocked circuits in which clock signal periods are variable.

Combinatorial logic circuits operate in response to clock signals in operating on input data or numbers. The length of the clock period of a typical integrated circuit is determined by a time which is needed to obtain complete stability of all logic states in the longest or critical path of the circuit. In an adder, for example, the time to add two random numbers can vary greatly depending on the number of carry signals. However, if such worse case conditions for processing numbers occur infrequently in the circuit, then during a large percentage of clock periods the circuit is clocked too slowly and the circuit experiences considerable idle time.

SUMMARY OF THE INVENTION

In accordance with the present invention the clock period for a clocked circuit is varied to minimize idle time of the circuit when operating on data.

In a preferred embodiment, the status of the circuit is determined by monitoring a voltage supply current. When the current is below a threshold level, the circuit is inactive or idle. When the current exceeds the threshold, the circuit is actively operating on data. Accordingly, the clock period when the circuit is operating on data is identified by monitoring the voltage supply current with the clock period being lengthened or shortened depending on the active state of the circuit as determined by the current level.

The invention and objects and features thereof will be more readily apparent from the following detailed description and appended claims when taken with the drawings.

BRIEF DESCRIPTION OF THE DRAWINGS

FIGS. 1A and 1B illustrate a conventional clock signal having a fixed period and a clock signal having a variable period in accordance with the invention, respectively.

FIGS. 2A and 2B illustrate the voltage supply current for a CMOS integrated circuit operating with the conventional clock of FIG. 1A and a voltage supply current for an integrated circuit operating with the variable clock of FIG. 1B, respectively.

FIG. 3 is a functional block diagram of a self-timing circuit in accordance with one embodiment of the invention.

DETAILED DESCRIPTION OF ILLUSTRATIVE EMBODIMENTS

Figure 4:
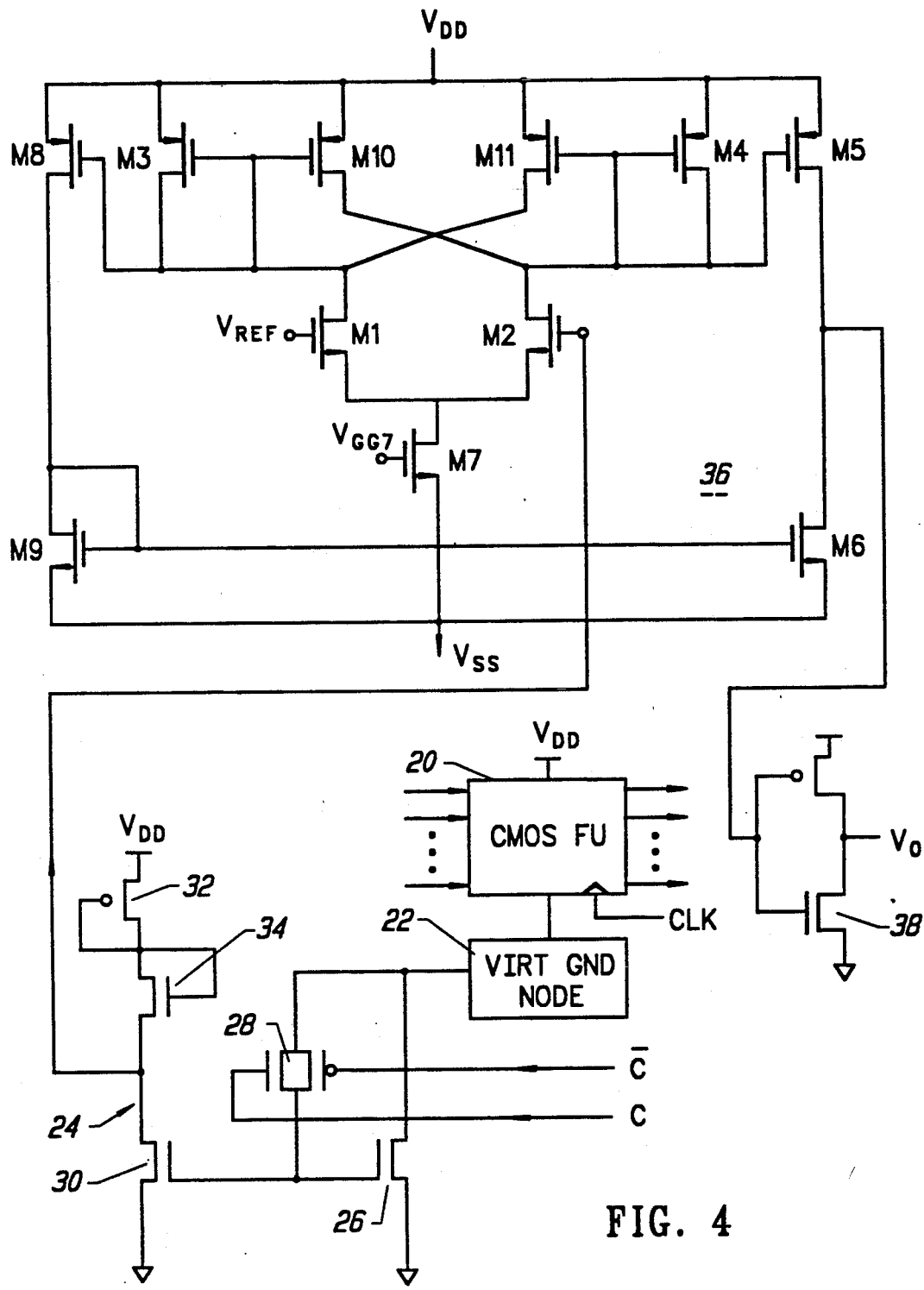
FIG. 4 is a schematic of a circuit for controlling a variable clock in accordance with one embodiment of the invention.

Referring now to the drawing, FIG. 1A illustrates a conventional clock signal having a fixed period or pulse width for the positive pulse between the rising and falling edges, A,B and C,D. As noted above the time period for each positive pulse depends on the critical path or the logical operation requiring the most time in operating on input data. Since some logic functions require much less time than the critical path time, a circuit can reach a stable state in operating on data long before the end of each positive pulse whereupon the circuit becomes inactive. If the worse case condition or critical path occurs infrequently, then the circuit is being clocked too slowly during a large percentage of clock periods.

In accordance with the present invention a method of self-timing is provided for an integrated circuit whereby each clock period can be varied by monitoring the level of activity of the circuit whereby inactive or idle time in each clock cycle is eliminated or at least minimized.

This is illustrated in the clock signal of FIG. 1B in which the time period for the first positive pulse A'B' is reduced to one-fourth the time period for the positive pulse A,B in FIG. 1A, whereas the length of a pulse C'D' is approximately the same as the time period of the pulse between C,D in FIG. 1A.

The periods of the clock cycles are determined by monitoring the active and inactive states of the integrated circuit. In accordance with one embodiment of the invention, the active and inactive states of a CMOS integrated circuit can be determined by monitoring the voltage supply current to the integrated circuit. Current above a threshold level indicates that the circuit is actively processing data, and supply current below the threshold indicates that the circuit has reached a stable state and has become inactive or idle. This is illustrated in FIG. 2A for the clock pulse of FIG. 1A. At the leading edge A the supply current is above the threshold but becomes inactive long before the falling edge B. The circuit again becomes active at the leading edge C and remains active to the falling edge D. By shortening the clock period as shown in FIG. 1B, the inactive period of the circuit is significantly reduced as illustrated by the active and inactive current levels of FIG. 2B for the pulses of FIG. 1B.

FIG. 3 is a functional block diagram of circuitry for implementing the clocking strategy illustrated in FIGS. 1B and 2B. The supply voltage $V_{DD}$ connected to the logic circuit 10 provides a current through the circuit to a virtual ground and thence through a current sensor 12 to circuit ground. The current sensor 12 can be a built-in current sensor of the type disclosed in Maly et al. U.S. Pat. No. 5,025,344. The current sensor monitors the supply current as the logic circuit operates on input data, and the threshold information is applied to clock circuit 14 which generates a variable pulse width clock signal which is applied to the clock input of the logic circuit 10. Accordingly, the clock frequency can be increased by varying the durations of the positive pulses. It will be appreciated that clock signals to several interconnected logic circuits can be varied and the time period between positive pulses can be determined in part by the active states of the interconnected logic circuits.

FIG. 4 is a detailed schematic of a current sensor and flag generating circuit for controlling the clock signal in accordance with one embodiment. The CMOS function unit 20, which can be similar to the logic circuit 10 of FIG. 3, is connected between the voltage supply $V_{DD}$ and virtual ground node 22 with the virtual ground connected through a current sensor circuit shown generally at 24 to circuit ground. The current sensor 24 includes a field effect transistor 26 serially connected between virtual ground and circuit ground with the gate of FET 26 connected through transmission gate 28 to the virtual ground. By clocking the transmission gate, a voltage is generated on the gates of transistor 26 and transistor 30 which is connected through load transistors 32, 34 to $V_{DD}$. The voltage generated across transistor 30 is a function of the active state of the CMOS function unit 20. This voltage is applied to an input of a bistable circuit 36 including cross-coupled transistors M1,M2 with the gate of transistor M1 receiving a voltage reference and the gate of transistor M2 receiving the voltage across transistor 30. The bistable circuit drives a CMOS transistor pair shown at 38 with the CMOS pair generating a flag signal, $\overline{V}_0$, which controls provides the clock circuit output.

The schematic of FIG. 4 is a test circuit which has been used for circuit level simulation with a 32 bit adder as a test vehicle connected to the ground rail through an integrated sensor of the type disclosed in U.S. Pat. No. 5,025,344, supra. Signals from the sensor were used to determine when the adder became inactive. The simulation was run for a sequence of random numbers applied as inputs for the adder under the test.

By controlling the positive pulses in a clock signal to when the clocked circuit is active, the inactive time period of the circuit is minimized thereby providing self-timing to the integrated circuit. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A self-timing integrated circuit comprising:
   a clocked function unit responsive to a clock signal for operating on variable numbers in logic operations of variable lengths of time, said function unit having an active period during a logic operation and an inactive period following a logic operation,
   sensing means for monitoring said function unit to identify active periods,
   clock means for generating a clock signal for said function unit, said clock signal having variable width pulses, and
   means coupling said sensing means to said clock means for controlling said variable width pulses in response to identified active periods.

2. The self-timing integrated circuit as defined by claim 1 wherein said sensing means comprises voltage supply current sensing means, an active period being identified when the voltage supply current exceeds a threshold value.

3. The self-timing integrated circuit defined by claim 2 wherein said clock means includes bistable circuit means having two output voltage levels corresponding to voltage supply currents exceeding said threshold level and not exceeding said threshold level, respectively.

4. The self-timing integrated circuit as defined by claim 1 wherein said clock means includes bistable circuit means having two output voltage levels corresponding to voltage supply currents exceeding a threshold level and not exceeding said threshold level, respectively.

5. The self-timing integrated circuit as defined by claim 1 wherein said integrated circuit comprises CMOS circuitry.

6. Apparatus for controlling the clock period for clock pulses applied to a clocked integrated circuit powered by a voltage supply comprising:
   sensing means for sensing current from said voltage supply to said integrated circuit and determining when said current exceeds a threshold level indicative of said integrated circuit being in an active state, and
   clocking means responsive to said sensing means for controlling pulse width of said clock pulses whereby positive pulses are provided during an active state.

7. Apparatus as defined by claim 6 wherein said clock means includes bistable circuit means having two output voltage levels corresponding to voltage supply currents exceeding said threshold level and not exceeding said threshold level, respectively.

8. A method of clocking an integrated circuit having active periods and inactive periods and which operates in response to positive pulses of a clock signal comprising the steps of:
   (a) monitoring said integrated circuit to identify active periods,
   (b) providing positive pulses to said integrated circuit during said active periods, and
   (c) removing positive pulses from said integrated circuit during inactive periods.

9. The method as defined by claim 8 wherein step (a) includes sensing power supply current to said integrated circuit, supply current above a threshold level being indicative of an active period.

10. A method of providing timing to an integrated circuit function unit which logically operates on variable length numbers during active periods of variable lengths of time comprising the steps of:
    (a) generating a clock signal having variable clock pulses for said integrated circuit,
    (b) monitoring said integrated circuit to identify active periods, and
    (c) controlling said variable clock pulses in response to identified active periods.

11. The method as defined by claim 10 wherein step (b) includes sensing power supply current to said integrated circuit whereby supply current above a threshold level is indicative of an active period.

* * * * *